United States Patent
Cen et al.

(10) Patent No.: US 12,543,523 B2
(45) Date of Patent: Feb. 3, 2026

(54) CHLORINE-FREE REMOVAL OF MOLYBDENUM OXIDES FROM SUBSTRATES

(71) Applicant: Applied Materials, Inc., Santa Clara, CA (US)

(72) Inventors: Jiajie Cen, San Jose, CA (US); Feng Q. Liu, San Jose, CA (US); Zheng Ju, Sunnyvale, CA (US); Zhiyuan Wu, San Jose, CA (US); Kevin Kashefi, San Ramon, CA (US); Mark Saly, Santa Clara, CA (US); Xianmin Tang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 300 days.

(21) Appl. No.: 18/382,326

(22) Filed: Oct. 20, 2023

(65) Prior Publication Data

US 2025/0132165 A1   Apr. 24, 2025

(51) Int. Cl.
*H01L 21/311* (2006.01)
(52) U.S. Cl.
CPC ............................. *H01L 21/31122* (2013.01)
(58) Field of Classification Search
None
See application file for complete search history.

(56) References Cited

U.S. PATENT DOCUMENTS

| | | | |
|---|---|---|---|
| 7,084,070 B1 | 8/2006 | Lee | |
| 9,478,434 B2 | 10/2016 | Wang et al. | |
| 9,837,312 B1 * | 12/2017 | Tan | C23C 18/1628 |
| 2011/0223755 A1 | 9/2011 | Kao et al. | |
| 2012/0329235 A1 | 12/2012 | Deweerd et al. | |
| 2016/0307748 A1 | 10/2016 | Saly | |
| 2017/0040214 A1 * | 2/2017 | Lai | H01L 21/76877 |
| 2018/0138405 A1 | 5/2018 | Mckerrow et al. | |
| 2019/0249312 A1 | 8/2019 | Blomberg et al. | |
| 2020/0075403 A1 | 3/2020 | Thombare et al. | |
| 2021/0090897 A1 | 3/2021 | Deepak et al. | |

(Continued)

FOREIGN PATENT DOCUMENTS

| | | |
|---|---|---|
| JP | 2011119437 A | 6/2011 |
| WO | 2020112237 A1 | 6/2020 |

(Continued)

OTHER PUBLICATIONS

"PCT International Search Report and Written Opinion in PCT/US2024/051354 dated Jan. 21, 2025, 10 pages".
"U.S. Appl. No. 17/961,153, filed Oct. 6, 2022, 26 pages".

*Primary Examiner* — Allan W. Olsen
(74) *Attorney, Agent, or Firm* — SERVILLA WHITNEY LLC

(57) ABSTRACT

Methods of removing molybdenum oxide from a surface of a substrate comprise exposing the substrate having a molybdenum oxide layer on the substrate to a halide etchant having the formula $R_mSiX_{4-m}$, wherein m is an integer from 1 to 3, X is selected from iodine (I) and bromine (Br) and R is selected from the group consisting of a methyl group, ethyl group, propyl group, butyl group, cyclohexyl group and cyclopentyl group. The methods may be performed in a back-end-of-the line (BEOL) process, and the substrate contains a low-k dielectric material.

20 Claims, 1 Drawing Sheet

(56) References Cited

U.S. PATENT DOCUMENTS

| | | | |
|---|---|---|---|
| 2021/0324525 A1 | 10/2021 | Das et al. | |
| 2023/0215763 A1 | 7/2023 | Byun | |
| 2024/0038541 A1 | 2/2024 | Cen et al. | |
| 2025/0112057 A1* | 4/2025 | Romero | ............ H01L 21/32135 |

FOREIGN PATENT DOCUMENTS

| | | |
|---|---|---|
| WO | 2021067362 A1 | 4/2021 |
| WO | 2023107867 A1 | 6/2023 |

* cited by examiner

CHLORINE-FREE REMOVAL OF MOLYBDENUM OXIDES FROM SUBSTRATES

TECHNICAL FIELD

Embodiments of the disclosure generally relate to electronic devices and methods of forming electronic devices. In particular, embodiments of the disclosure relate to etching of molybdenum oxides with non-chlorine etchants.

BACKGROUND

When molybdenum (Mo) surfaces are exposed to oxygen, the surfaces form a layer of molybdenum oxide ($MoO_x$). Removal of the $MoO_x$ requires harsh processes that are not compatible with back-end-of-the-line (BEOL) packaging processes. During BEOL processes, the $MoO_x$ may form in areas of low-k dielectric materials that are highly susceptible to damage caused by traditional precleaning processes. Traditional hydrogen-based plasma processes can be used to remove $MoO_x$, however, these traditional hydrogen-based plasma processes cannot fully reduce $MoO_x$ due to the high stability of Mo(OH) y and difficulty of de-hydration. Another common way is to remove $MoO_x$ use $MoCl_x$ (x=4-6) to etch $MoO_x$, but this approach is limited by temperature, and non-selectivity over Mo and CI residue, which restricted use of $MoCl_x$ etching in BEOL. Accordingly, new methods for removal of $MoO_x$ are needed that are compatible with BEOL packaging processes.

SUMMARY

One or more embodiments of the disclosure are directed to methods of processing a substrate. In one or more embodiments, a processing method comprises exposing the substrate having a molybdenum oxide layer on the substrate to a halide etchant having the formula $R_mSiX_{4-m}$, wherein m is an integer from 1 to 3, X is selected from iodine (I) and bromine (Br) and R is selected from the group consisting of a methyl group, ethyl group, propyl group, butyl group, cyclohexyl group and cyclopentyl group. The halide etchant in one or more embodiments is in gas form and is an etchant gas.

One or more embodiments may further comprise exposing the substrate having the molybdenum oxide layer on the substrate to a purge gas, and wherein exposing the substrate having the molybdenum oxide layer on the substrate to the etchant gas and the purge gas comprises an atomic layer etching cycle.

Embodiments may further comprise non-transitory, computer readable medium having instructions stored thereon that, when executed, causes a processing chamber to perform a method comprising exposing the substrate having a molybdenum oxide layer on the substrate to a halide etchant having the formula $R_mSiX_{4-m}$, wherein m is an integer from 1 to 3, X is selected from iodine (I) and bromine (Br) and R is selected from the group consisting of a methyl group, ethyl group, propyl group, butyl group, cyclohexyl group and cyclopentyl group and comprise exposing the substrate having the molybdenum oxide layer on the substrate to a purge gas, and wherein exposing the substrate having the molybdenum oxide layer on the substrate to the etchant gas and the purge gas comprises an atomic layer etching cycle.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
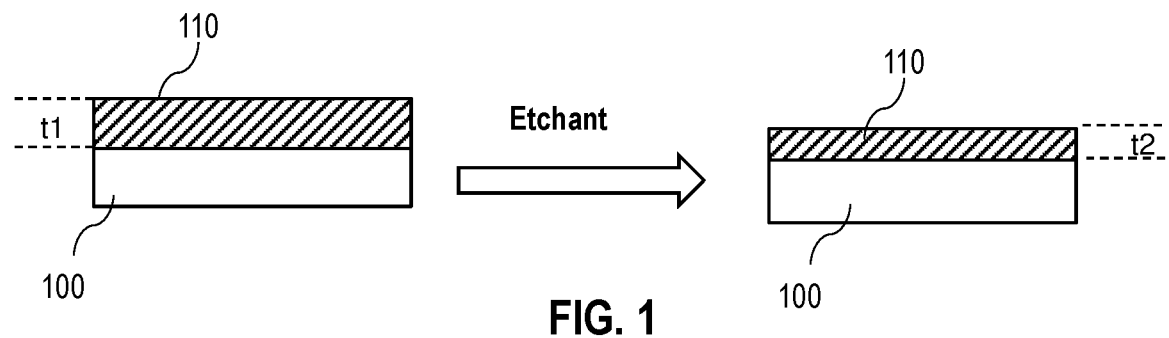
FIG. 1 is a schematic view of a method of removing molybdenum oxide from a substrate according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

The methods provided herein according to one or more embodiments provide an improved process for removing molybdenum oxide ($MoO_x$) in back-end-of-the-line (BEOL) processes. Current BEOL preclean processes are challenged to reduce or remove molybdenum oxide without damage to low-k materials. The methods have the advantage over traditional BEOL preclean processes in that the methods can achieve full removal of MoO$_x$ with no chlorine residue in the low-k material and no significant carbon loss or damage to the low-k material. The methods are also compatible with current BEOL hydrogen gas (H$_2$) preclean approaches and integration flows. The methods also have the advantage of being able to more fully reduce MoO$_x$ compared to traditional hydrogen-based plasma processes and to avoid problems with de-hydration.

While molybdenum materials/doping have been used in front-end-of-the-line (FEOL) structure manufacturing processes, molybdenum materials/doping have not been used in BEOL processes due to the inability to remove MoO$_x$ in areas containing low-k materials. Molybdenum materials/doping provides for the formation of enhanced performance contacts formed during middle-of-the-line (MOL) processes such as in logic applications. Providing improved processes for the removal of the exposed molybdenum materials during BEOL packaging processes, such MOL contacts become possible. Current processes lack any feasible approaches to reduce or remove the MoO$_x$ for BEOL without dealing significant damage to the low-k dielectric materials.

For example, strong plasma treatments may be able to fully reduce MoO$_x$, but would inevitably cause unacceptable damage to the low-k dielectric material. Therefore, such an approach cannot be applied to BEOL applications. However, according to one or more embodiments of the present disclosure, methods are provided to remove MoO$_x$ with negligible damage to the low-k dielectric materials. In some embodiments, a chlorine-free process is used to remove the MoO$_x$ at a process temperature of approximately below 400° C., for example in a range of from 150° C. to 400° C., 200° C. to 400° C., 250° C. to 400° C., 300° C. to 400° C., 150° C. to 350° C., 200° C. to 350° C., 250° C. to 350° C., 300° C. to 350° C., 150° C. to 300° C., 200° C. to 300° C., and 250° C. to 300° C. The chlorine-free methods according to one or more embodiments are configured to remove MoO$_x$ with no negative chlorine impacts to BEOL applications such methods involving a barrier, a liner and Cu layers. The methods according to some embodiments utilizes an atomic layer etching (ALE) process.

As semiconductor devices continue to increase in design and material component complexity, the selective removal of materials has become critical for continued scaling and improvement of semiconductor devices. Selective atomic layer etching (ALE) has emerged as a precise etching method that employs self-limiting surface reactions. Selective ALE of metal oxides (MO$_x$) is particularly important for a number of semiconductor technologies but can be difficult to accomplish due to the inherent stability of these oxide materials.

Atomic layer etching involves the exposure of a substrate to an etchant gas for a first period of time and then exposure to a purge gas for a second period of time. The exposure to the etchant gas and a purge gas comprises an atomic layer etching cycle, and the atomic layer etching cycle may be repeated multiple times to achieve the desired level of removal of the molybdenum oxide layer from the surface of the substrate.

Referring now to FIG. 1, a schematic view of an atomic layer etching process is shown. A substrate 100 having a molybdenum oxide layer 110 on the substrate is exposed to an etchant for a first period of time. The molybdenum oxide layer has a thickness (t1) prior to exposure to the etchant. After exposure to the etchant, the molybdenum oxide layer 110 has a thickness (t2) that is less than the thickness (t1). Thereafter, the substrate 100 having the molybdenum oxide layer 110 on the substrate 100 may be exposed again to the etchant to further reduce the thickness (t2) of the molybdenum oxide layer 110. In one or more embodiments, prior to a second exposure to the etchant gas, the substrate 100 having the molybdenum oxide layer 110 thereon is exposed to a purge gas. Each exposure of the substrate 100 having the molybdenum oxide layer thereon comprises a cycle. The cycle may be repeated from 1 to 1000 time to reduce the thickness of the molybdenum oxide layer 110. In some embodiments, the cycle is repeated until the molybdenum oxide layer 110 is removed from the substrate.

The purge gas is configured to remove etchant gas and any etching by-products away from the substrate. In one or more embodiments, the purge gas is selected from an inert gas, such as nitrogen, argon and helium.

Figure 2:
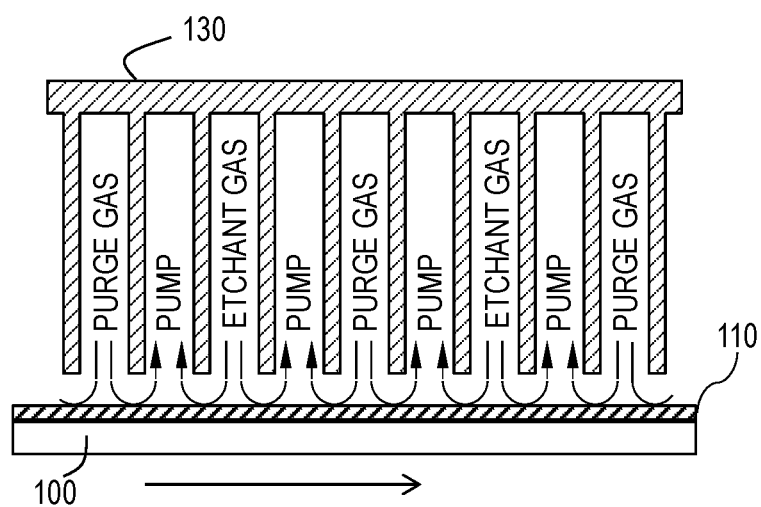
FIG. 2 is a schematic view of a method of removing molybdenum oxide from a substrate according to one or more embodiments using a gas distribution plate.

In some embodiments, exposure of the substrate 100 having the molybdenum oxide layer 110 thereon may be exposed the etchant gas and the purge gas by a gas distribution plate 130 that is part of an atomic layer etching chamber (not shown). Referring now to FIG. 2, the gas distribution plate comprises alternating channels which are configured to direct alternating streams of an etchant gas and a purge gas. In some embodiments, the gas distribution plate 130 includes an optional pump channel disposed between etchant gas channel and purge channel. The gas distribution plate 130 can be any suitable distribution plate known to those skilled in the art, and specific gas distribution plates described should not be taken as limiting the scope of the invention. The output face of the gas distribution plate 130 faces the molybdenum oxide layer 110 on the substrate.

Additional embodiments of the invention are directed to methods of processing a substrate. The substrate 100 having a molybdenum oxide layer 110 thereon is moved laterally adjacent to the gas distribution plate 130 comprising a plurality of elongate gas channels connected to supplies of a purge gas and an etchant gas. The elongate gas channels include a first gas port to deliver an etchant gas and a second gas port to deliver a purge gas. The first gas is delivered to the substrate surface and the second gas is delivered to the substrate surface. The process or exposure time for each of the etchant gas and the purge gas can be in the range of about 0.001 second to about 60 seconds. In an exemplary embodiment, exposure to the etchant gas occurs for a period of from about 0.5 seconds to 1.5 seconds and exposure to the purge gas occurs from about 2 to 30 seconds, for example 5 seconds.

This type of ALE process may be referred to as a spatial ALE, where the etchant gas and the purge gas are flowed into separate regions of a processing chamber and the substrate is moved between and among the regions. The different regions are separated by vacuum stream or pump to prevent mixing of etchant gas and the purge gas. The ALE process can also be performed by a time-domain process where the processing chamber is filled with the etchant gas and then purged to remove the excess etchant gas and etchant by-products. In the time-domain process, the substrate can remain stationary.

Thus, according to one or more embodiments methods are provided that are useful in back-end-of-the line (BEOL) processes, for example, where the substrate contains a low-k dielectric material.

Thus, an exemplary embodiment is directed to a method of removing molybdenum oxide from a surface of a substrate, the method comprising exposing the substrate having a molybdenum oxide layer on the substrate to a halide etchant having the formula R$_m$SiX$_{4-m}$, wherein m is an integer from 1 to 3, X is selected from iodine (I) and bromine (Br) and R is selected from the group consisting of a methyl group, ethyl group, propyl group, butyl group, cyclohexyl group and cyclopentyl group. The method can be performed in a substrate processing chamber including a gas distribution plate or in any type of substrate processing chamber capable of performing an atomic layer etching (ALE) process. In some embodiments, the X is any halide.

In some embodiments, the halide is bromine (Br). In other embodiments, the halide is iodine (I). Exposing the substrate occurs at temperature in a range of from a range of from 150° C. to 400° C. according to some embodiments, more particularly in a range of from 200° C. to 400° C. or in a range of from 250° C. to 400° C.

In some specific embodiments, the method comprises exposing the substrate having the molybdenum oxide layer on the substrate to a purge gas, and wherein exposing the substrate having the molybdenum oxide layer on the substrate to the etchant gas and the purge gas comprises an atomic layer etching cycle. In some embodiments, the purge gas is an inert gas. Exposing the substrate and the molybdenum oxide layer reduces the thickness of the molybdenum oxide layer. The cycle can be repeated multiple times to reduce the thickness of the molybdenum oxide layer to a desired thickness or target thickness. In some embodiments, the method comprises completely removing the molybdenum oxide layer from the substrate.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

One or more method embodiments according to the present disclosure may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

For example, embodiments may further comprise non-transitory, computer readable medium having instructions stored thereon that, when executed, causes a processing chamber to perform a method comprising exposing the substrate having a molybdenum oxide layer on the substrate to a halide etchant having the formula $R_mSiX_{4-m}$, wherein m is an integer from 1 to 3, X is selected from iodine (I) and bromine (Br) and R is selected from the group consisting of a methyl group, ethyl group, propyl group, butyl group, cyclohexyl group and cyclopentyl group and comprise exposing the substrate having the molybdenum oxide layer on the substrate to a purge gas, and wherein exposing the substrate having the molybdenum oxide layer on the substrate to the etchant gas and the purge gas comprises an atomic layer etching cycle.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of removing molybdenum oxide from a surface of a substrate, the method comprising:
    exposing the substrate having a molybdenum oxide layer on the substrate to a halide etchant having the formula $R_mSiX_{4-m}$, wherein m is an integer from 1 to 3, X is selected from iodine (I) and bromine (Br) and R is selected from the group consisting of a methyl group, ethyl group, propyl group, butyl group, cyclohexyl group and cyclopentyl group.

2. The method of claim 1, wherein the halide is bromine (Br).

3. The method of claim 2, wherein exposing the substrate occurs at temperature in a range of from a range of from 150° C. to 400° C.

4. The method of claim 3, wherein the temperature is in a range of from 200° C. to 400° C.

5. The method of claim 3, wherein the temperature is in a range of from 250° C. to 400° C.

6. The method of claim 1, wherein the halide is iodine (I).

7. The method of claim 6, wherein exposing the substrate occurs at temperature in a range of from a range of from 150° C. to 400° C.

8. The method of claim 7, wherein the temperature is in a range of from 200° C. to 400° C.

9. The method of claim 8, wherein the temperature is in a range of from 250° C. to 400° C.

10. The method of claim 1, wherein exposing the substrate occurs at temperature in a range of from a range of from 150° C. to 400° C.

11. The method of claim 10, wherein the temperature is in a range of from 200° C. to 400° C.

12. The method of claim 10, wherein the temperature is in a range of from 250° C. to 400° C.

13. The method of claim 1, further comprising exposing the substrate having the molybdenum oxide layer on the substrate to a purge gas, and wherein exposing the substrate having the molybdenum oxide layer on the substrate to the halide etchant and the purge gas comprises an atomic layer etching cycle.

14. The method of claim 13, wherein the purge gas is an inert gas.

15. The method of claim 13, wherein exposing the substrate and the molybdenum oxide layer reduces the thickness of the molybdenum oxide layer.

16. The method of claim 15, further comprising repeating the cycle multiple times.

17. The method of claim 16, further comprising removing the molybdenum oxide layer from the substrate.

18. The method of claim 13, wherein the method is performed in a back-end-of-the line (BEOL) process.

19. The method of claim 18, wherein the substrate contains a low-k dielectric material.

20. A non-transitory, computer readable medium having instructions stored thereon that, when executed, causes the method of claim 13 to be performed.

\* \* \* \* \*